United States Patent [19]

Vinal

[11] Patent Number: 5,001,367
[45] Date of Patent: Mar. 19, 1991

[54] HIGH SPEED COMPLEMENTARY FIELD EFFECT TRANSISTOR LOGIC CIRCUITS

[75] Inventor: Albert W. Vinal, Cary, N.C.

[73] Assignee: Thunderbird Technologies, Inc., Cary, N.C.

[21] Appl. No.: 338,280

[22] Filed: Apr. 14, 1989

[51] Int. Cl.$^5$ ............... H03K 19/003; H03K 19/017; H03K 19/094; H03K 17/04
[52] U.S. Cl. .................... 307/448; 307/443; 307/451; 307/449
[58] Field of Search ............ 307/443, 448, 450, 451, 307/481, 482, 571, 585, 579, 475, 542, 449, 279, 542.1

[56] References Cited

U.S. PATENT DOCUMENTS

| | | | |
|---|---|---|---|
| T952,012 | 11/1976 | Lee | 307/451 |
| 3,728,556 | 4/1973 | Arnell | 307/279 X |
| 3,911,289 | 10/1975 | Takemoto | 307/304 |
| 4,045,692 | 8/1977 | Morokawa et al. | 307/542.1 X |
| 4,053,792 | 10/1977 | Cannistra et al. | 307/270 |
| 4,080,539 | 3/1978 | Stewart | 307/279 X |
| 4,216,390 | 8/1980 | Stewart | 307/279 X |
| 4,258,272 | 3/1981 | Huang | 307/475 |
| 4,390,988 | 6/1983 | Best et al. | 307/448 X |
| 4,491,741 | 1/1985 | Parker | 307/450 |
| 4,567,385 | 1/1986 | Falater et al. | 307/443 |
| 4,645,952 | 2/1987 | van Tran | 307/451 |
| 4,649,296 | 3/1987 | Shoji | 307/451 |
| 4,701,642 | 10/1987 | Pricer | 307/451 |
| 4,701,643 | 10/1987 | Laude et al. | 307/450 |
| 4,764,691 | 8/1988 | Jochem | 307/468 |
| 4,785,204 | 11/1988 | Terada et al. | 307/451 |
| 4,798,979 | 1/1989 | Lee et al. | 307/450 |
| 4,810,906 | 3/1989 | Shah et al. | 307/448 |
| 4,877,976 | 10/1989 | Lach et al. | 307/448 X |

FOREIGN PATENT DOCUMENTS 53-36167  4/1978 Japan ............... 307/448
60-236322 11/1985 Japan ............... 307/451

OTHER PUBLICATIONS

Chadwick et al., "Circuit Gate Width as a Function of Ground Shift Designing", IBM Tech. Discl. Bull., vol. 21, No. 4, pp. 1560-1562, Sep. 1978.
Fink et al., *Electronic Engineer's Handbook*, pp. 16-16 to 16-19, 1982.

Primary Examiner—Stanley D. Miller
Assistant Examiner—David R. Bertelson
Attorney, Agent, or Firm—Bell, Seltzer, Park & Gibson

[57] ABSTRACT

A high speed, high density, low power dissipation all parallel FET logic circuit includes a driving stage having a plurality of parallel FETs of a first conductivity type for receiving logic input signals and a load FET of second conductivity type connected to the common output of the driving stage. A complementary FET inverter including serially connected FETs of first and second conductivity type is connected to the common output and the load FET. According to the invention the voltage transfer function of the complementary inverter is skewed so that the product of the carrier mobility and the ratio of channel width to length of the inverter FET of the first conductivity type is made substantially greater than the product of the carrier mobility and the ratio of channel width to length of the inverter FET of the second conductivity type. By skewing the voltage transfer function of the complementary inverter the voltage lift-off interval is dramatically decreased, thereby improving the speed. AND and OR circuits and combined AND-OR circuits may be provided, having true and complement outputs. A multigate serial load transistor may further reduce power consumption.

20 Claims, 6 Drawing Sheets fig. 1.

HIGH SPEED COMPLEMENTARY FIELD EFFECT TRANSISTOR LOGIC CIRCUITS

FIELD OF THE INVENTION

This invention relates to digital logic circuits of the kind that may be employed in integrated circuits, and more particularly to high speed, high density, low power complementary field effect transistor logic circuits.

BACKGROUND OF THE INVENTION

Complementary Field Effect Transistor (FET) logic circuits, and in particular Complementary Metal Oxide Semiconductor (CMOS) logic circuits have become increasingly popular for high density integrated circuit logic, among other reasons because of their high density and low power dissipation. A typical CMOS logic gate is illustrated in FIG. 1 of U.S. Pat. No. 3,911,289 to Takemoto entitled *MOS Type Semiconductor IC Device*. A CMOS logic gate typically includes a driving stage having a plurality of FETs of a first conductivity type connected in parallel and a load stage comprising a like plurality of serially connected FETs of opposite conductivity type. Each logic signal input is applied simultaneously to a pair of transistors, one driver and one load.

Unfortunately, the serial connection of the load transistors in conventional CMOS logic gates reduces the toggle rate or switching speed of the gate and also reduces the number of inputs which may be applied to the gate (referred to as "fan-in"). To overcome these problems, an "all parallel" CMOS logic gate design has heretofore been proposed. For example, FIG. 3A of the aforementioned U.S. Pat. No. 3,911,289 discloses an all parallel logic gate in which the serial load transistors are replaced by a first load which may be a MOS transistor or a resistor and a second load comprising a MOS transistor having opposite conductivity type from the driver stage transistors. The first and second loads are connected in parallel. A complementary MOS inverter is also provided between the output of the driving stage and a voltage source. A similar structure is disclosed in Japanese Patent No. 60-236,322 to Yoshida entitled *MOS Transistor Circuit*.

While prior art "all parallel" FET transistor logic circuits may provide some improvement to the basic CMOS logic gate, the performance improvement is only about a factor of two. Moreover, a separate "pull-up" circuit is needed to raise the output voltage of the gate in response to an input signal. These pull-up circuits in the form of resistors or additional transistors add to the circuit complexity of the logic gate and also increase the power dissipation thereof.

Attempts have been made to improve the response of all parallel FET logic without requiring excessive pull-up power. See for example U.S. Pat. No. 4,649,296 to Shoji entitled *Synthetic CMOS Static Logic Gates*. However, as illustrated in the Shoji patent, highly complex circuits employing many devices per gate are required, thereby negating the high density advantage of CMOS logic. Other attempts have been made to provide improved pull-up circuits. See for example U.S. Pat. No. 4,053,792 to Cannistra et al. entitled *Low Power Complementary Field Effect Transistor (CFET) Logic Circuit* in which an active pull-up device replaces a passive resistor. However, this device includes serial load transistors which negate the advantages of an "all parallel logic" approach.

SUMMARY OF THE INVENTION

It is therefore an object of the present invention to provide a high speed, high density, low power dissipation complementary FET logic circuit.

It is another object of the invention to provide an all parallel FET logic circuit.

It is still another object of the invention to provide an FET logic circuit which eliminates the need for power consuming pull-up circuits.

These and other objects are provided according to the invention by an FET logic circuit which comprises a driving stage including at least one FET of a first conductivity type having at least one control electrode for receiving logic input signals. The driving stage FETs are connected between a common output and a first potential level. A load FET of second conductivity type is provided and connected between a second potential and the common output in an "inverted drain follower" configuration. A complementary FET inverter is also provided which comprises an FET of the first conductivity type and an FET of the second conductivity type serially connected between the first and second potential levels, with the output of the complementary inverter being connected to the control electrode of the load FET.

According to the invention, the voltage transfer function of the complementary FET inverter is deliberately skewed, in contrast with a conventional symmetrical complementary inverter design. More particularly, the product of the carrier mobility and the ratio of channel width to length of the inverter FET of the first conductivity type is made substantially greater than the product of the carrier mobility and the ratio of channel width to length of the inverter FET of the second conductivity type. In a preferred embodiment this difference is a factor of four.

By skewing the voltage transfer function of the complementary inverter of the present invention the voltage lift-off interval for the logic gate is dramatically decreased thereby improving the speed of the gate. Moreover, if the inverted drain follower is a depletion mode FET, additional pull-up transistors or resistors are not needed. The depletion mode FET provides the total lift-off function by providing a sustaining current to control snap-off. Power dissipation is thereby reduced while providing high speed and low device count. OR and AND circuits may be provided.

According to another embodiment of the invention, a second load FET of the second conductivity type may be provided which is connected between the second potential level and the common output, with the control electrode of the second load being connected to any one of the control electrodes of the driving stage FETs. The second load FET provides lift-off current only when the appropriate control electrode is activated, which minimizes idle power dissipation while increasing switching speed. An enhancement mode transistor is preferably employed.

According to yet another embodiment of the present invention a second complementary FET inverter may be provided in which the voltage transfer function is maintained symmetrical i.e, it is not skewed. This second inverter is connected in parallel with the first inverter, with the output of the second inverter being connected to the control electrode of the second load FET and its input connected to the control electrode of the first load FET. The use of a second inverter also provides a complement output (i.e. NAND and NOR) for the logic gate.

The second load FET may comprise a multigate FET with a respective one of the gate electrodes being connected to a respective one of the control electrodes of the driving stage FETs. Although this embodiment provides slightly slower switching speed because of the serial multigate load FET, essentially zero power consumption may be provided. A multigate FET and/or a series-parallel arrangement of FETs may also be substituted for at least one of the driving stage transistors to provide "matrix logic" circuits which implement complex logic functions.

DETAILED DESCRIPTION OF THE PRESENT INVENTION

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
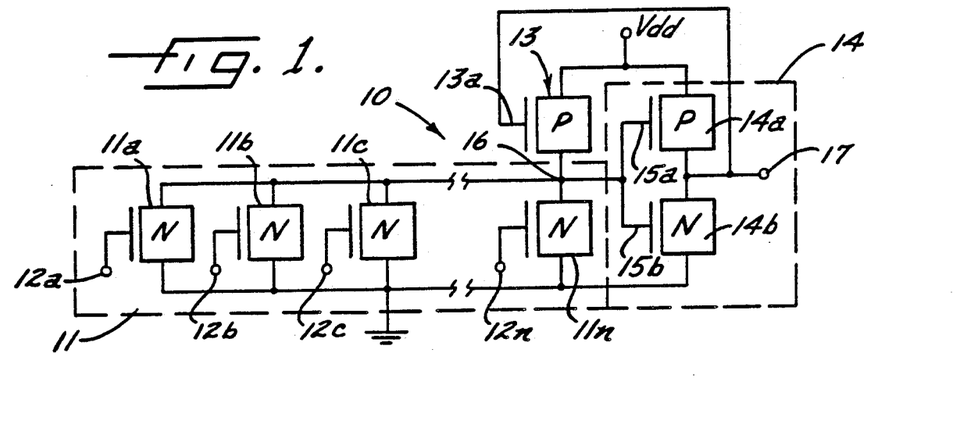
FIG. 1 is a circuit schematic diagram of an FET logic OR circuit according to the present invention.

Referring now to FIG. 1 an FET logic OR circuit 10 according to the invention Will now be described. The circuit of FIG. 1 includes a driving stage 11 which comprises a plurality of N-type FETs 11a-11n. Each of the driving stage FETs 11 includes a control electrode 12a-12n for receiving logic input signals. The driving stage FETs 11 are connected in parallel between ground potential and a common output 16. The driving stage FETs are preferably enhancement type FETs having an induced channel when the potential at control electrodes 12a-12n is near ground potential. A P-type load FET 13 is connected between the power supply potential $V_{dd}$ and the common output 16, in an inverted drain follower configuration. Logic gate 10 also includes a complementary FET inverter 14 including P-type transistor 14a and N-type transistor 14b. According to the invention, the design parameters of transistors 14a and 14b are skewed so that a skewed complementary inverter voltage transfer function is produced. This skewed voltage transformer function dramatically reduces the lift-off interval and eliminates the need for a separate pull-up transistor as will be described in detail below. Complementary FET inverter 14 may also be referred to as a "coupling inverter".

Still referring to FIG. 1 the complementary FET inverter 14 is serially connected betWeen $V_{dd}$ and ground, with the output 17 of the complementary inverter 14 being the output of the logic gate 10. The output 17 is also connected to the gate 13a of inverted drain follower load transistor 13. The gates 15a and 15b of the complementary inverter are also connected to the common output 16.

According to the invention, the product of the carrier mobility and the ratio of channel width to length of FET 14b is made substantially greater than the product of the carrier mobility and the ratio of width to length of the type FET 14a. In other words, $\mu_{14b}Z_{14b}/L_{14b} >> \mu_{14a}Z_{14a}/L_{14a}$, where $\mu$ is the carrier mobility, Z is the channel width and L is the channel length of respective transistors 14a and 14b. By deliberately skewing the voltage transfer function of the coupling inverter 14, a switching speed of 500 MHz or greater may be obtained, which is a factor of five or more than prior art all parallel logic designs, for example the design disclosed in the aforementioned U.S. Pat. No. 3,911,289. The skewed complementary inverter design also dramatically minimizes the need for lift-off current which increases the power dissipation and reduces the switching speed of FET logic circuits.

Figure 2:
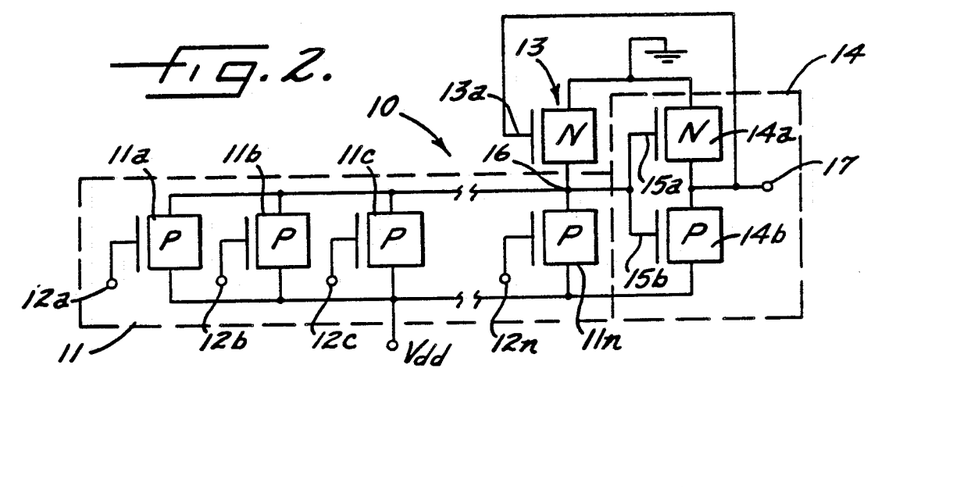
FIG. 2 is a circuit schematic diagram of an FET logic AND circuit according to the present invention.

Referring now to FIG. 2 an FET logic AND circuit according to the present invention is shown. It will be seen that the circuit of FIG. 2 is identical with the circuit of FIG. 1 except that the N- and P- devices have been interchanged, and the ground becomes $V_{dd}$ and vice versa. As is well known to those having skill in the art, an N-channel transistor is turned on with an up logic level and off with a down logic level, while a P-channel transistor is turned off with an up logic level and on with a down logic level. Accordingly, the circuit of FIG. 2 provides an AND logic function. The skewed inverter design of transistors 14a and 14b, described in connection with FIG. 1, is also provided in the AND circuit of FIG. 2.

Figure 3:
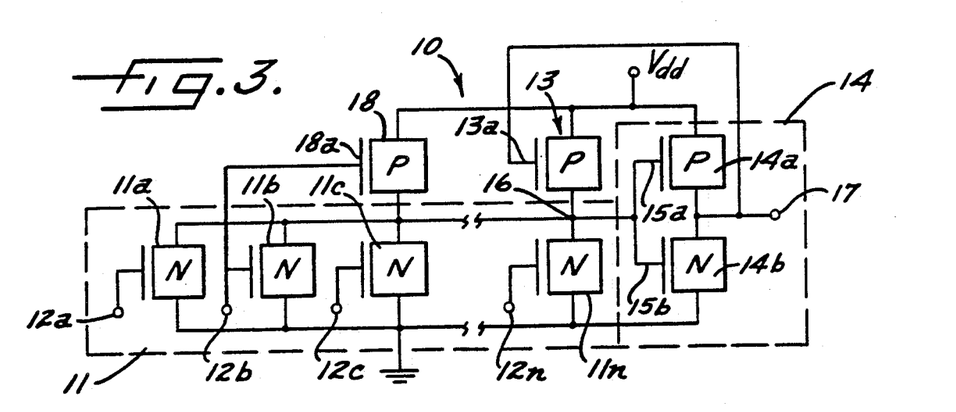
FIG. 3 is a circuit schematic diagram of an alternate embodiment of an FET logic OR circuit according to the present invention.

Referring now to FIG. 3, an alternate embodiment of an OR logic circuit according to the present invention is shown. It will be recognized by those having skill in the art that each of the circuits of FIGS. 3-7 may be provided in an AND configuration by interchanging the N- and P-devices and voltage terminals. The circuit of FIG. 3 is identical with the circuit of FIG. 1 except that an additional lift-off transistor 18 is provided, the gate 18a of which is connected to one of the gates 12 of the driving stage FETs. In FIG. 3 gate 18a is shown connected to gate 12b. According to the invention, lift-off transistor 18 is activated when and only when the connected logic gate 12b is up for an AND gate and down for an OR gate thereby minimizing idle power dissipation while increasing the switching speed of the logic circuit.

Figure 4:
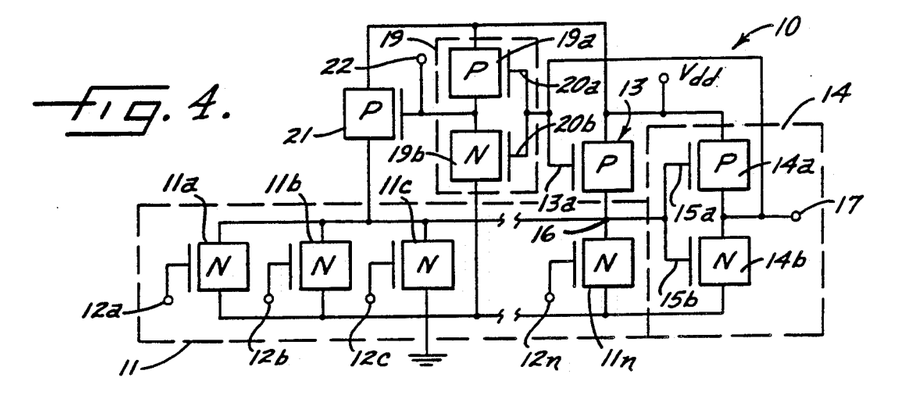
FIG. 4 is a circuit schematic diagram of another alternate embodiment of an FET logic OR circuit according to the present invention.

Referring now to FIG. 4 another alternate embodiment of an OR circuit is provided. This circuit is identical to the circuit of FIG. 1 except that a second coupling inverter 19 and a second load transistor 21 are provided. Coupling inverter 19 comprises P- transistor 19a and N- transistor 19b, the gates 20a and 20b of which are coupled to gate 13a of inverted drain follower 13. The output 22 of the second coupling inverter 19 is connected to a second inverted drain follower 21 which itself is connected between power supply voltage $V_{dd}$ and common output 16. Accordingly, a compliment output 22 for the logic gate 10 is provided. According to the invention, the voltage transfer function of inverter 19 is not skewed; i.e. the transistor design parameters are substantially similar, in contrast with coupling inverter 14 for which the voltage transfer function is deliberately skewed.

Figure 5:
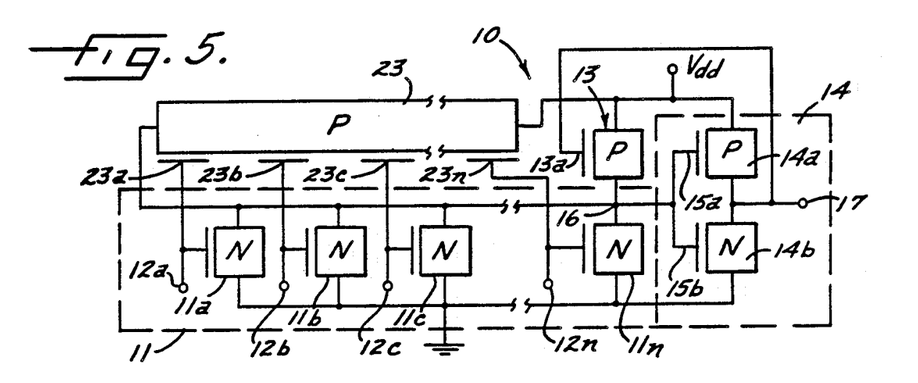
FIG. 5 is a circuit schematic diagram of yet another alternate embodiment of an FET logic OR gate of the present invention.

Referring now to FIG. 5, a hybrid logic circuit is illustrated which is identical to FIG. 3 except that a multigate lift-off transistor 23 is provided. In a preferred embodiment multigate lift-off transistor 23 is a Fermi-FET, as disclosed in co-pending application Ser. No. 318,153 Filed Mar. 2, 1989 entitled *Fermi Threshold Field Effect Transistor*, the disclosure of which is hereby incorporated herein by reference. As illustrated in the aforementioned co-pending application Ser. No. 318,153, a multigate Fermi-FET may be provided with diffusion rails without the need for contact metal, to provide a high speed, high density device. The gates 23a–23n of multigate Fermi-FET transistor 23 are connected to a respective gate 12a–12n of the driving stage transistors 11a–11n. The source and drain of multigate Fermi-FET 23 are connected between power supply $V_{dd}$ and common output 16. The serial Fermi-FET slightly decreases the switching speed of the device because the serial gate structure lowers the lift-off current. However, because the lift-off current in the serial Fermi-FET 23 only flows when all of the gates 23a–23n are down, all idle power dissipation is eliminated. Accordingly, total power dissipation is greatly reduced at a slight speed penalty. The "hybrid" parallel logic of FIG. 5 thereby eliminates all idle DC power while maintaining high switching rates at a modest increase in component cost.

Figure 6:
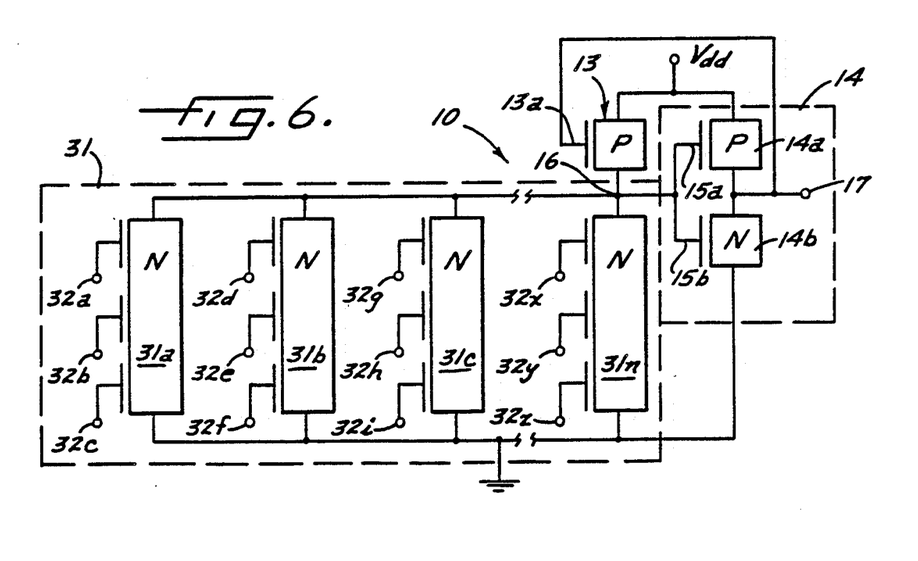
FIG. 6 is a circuit schematic diagram of an FET matrix logic circuit according to the present invention.

Referring now to FIG. 6 a matrix logic implementation is shown. FIG. 6 is identical to the structure of FIG. 1 except that the single gate transistors of driving stage 11 are replaced by multigate transistors 31a–31n of driving stage 31. Transistors 31a–31n are preferably Fermi-FET transistors. Transistors 31a–31n each include a plurality of gates 32a–32z. Accordingly, at a slight decrease in speed, complex logic functions may be achieved with great economy of hardware. The logic gate of FIG. 6 implements a sum of products configuration, i.e. $(32a \cdot 32b \cdot 32c) + (32d \cdot 32e \cdot 32f) + \ldots (32x \cdot 32y \cdot 32z)$.

Figure 7:
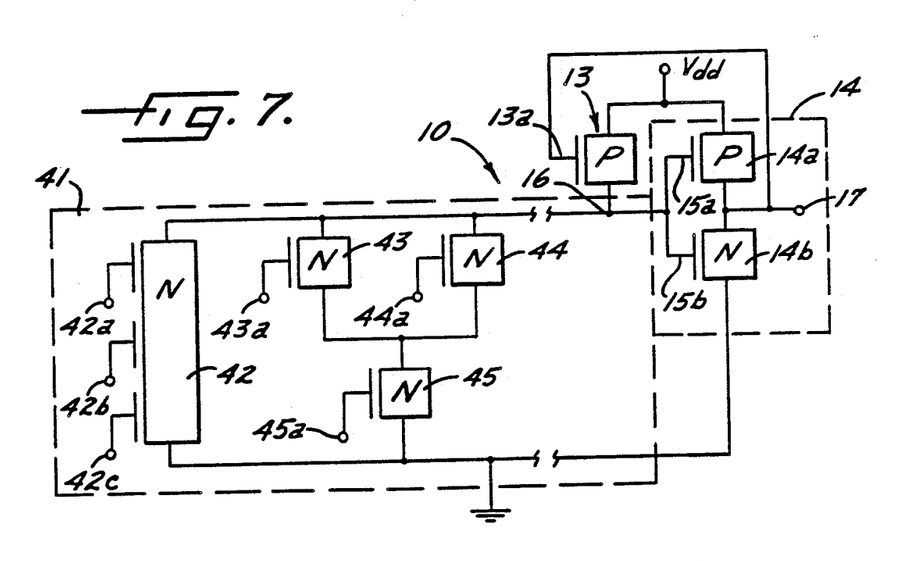
FIG. 7 is a circuit schematic diagram of an alternate embodiment of an FET matrix logic circuit according to the present invention.

Referring now to FIG. 7, a second matrix logic implementation is shown. FIG. 7 is identical to the structure of FIG. 1 except that the single gate transistor of driving stage 11 is replaced by a multigate transistor 42 and a series/parallel combination of transistors 43–45 of driving stage 41. FETs 43 and 44 are connected in parallel with one another and in series with FET 45 between common output 16 and ground. It will be understood by those having skill in the art that other combinations of FETs, in single gate, multigate, parallel, series and series/parallel configurations, may be provided to implement any desired complex logic function. For example, the logic gate of FIG. 7 implements the logic function $42a \cdot 42b \cdot 42c + (43a \cdot 45a + 44a \cdot 45a) + (43a \cdot 4 \cdot 4a \cdot 45a)$.

Figure 8A:
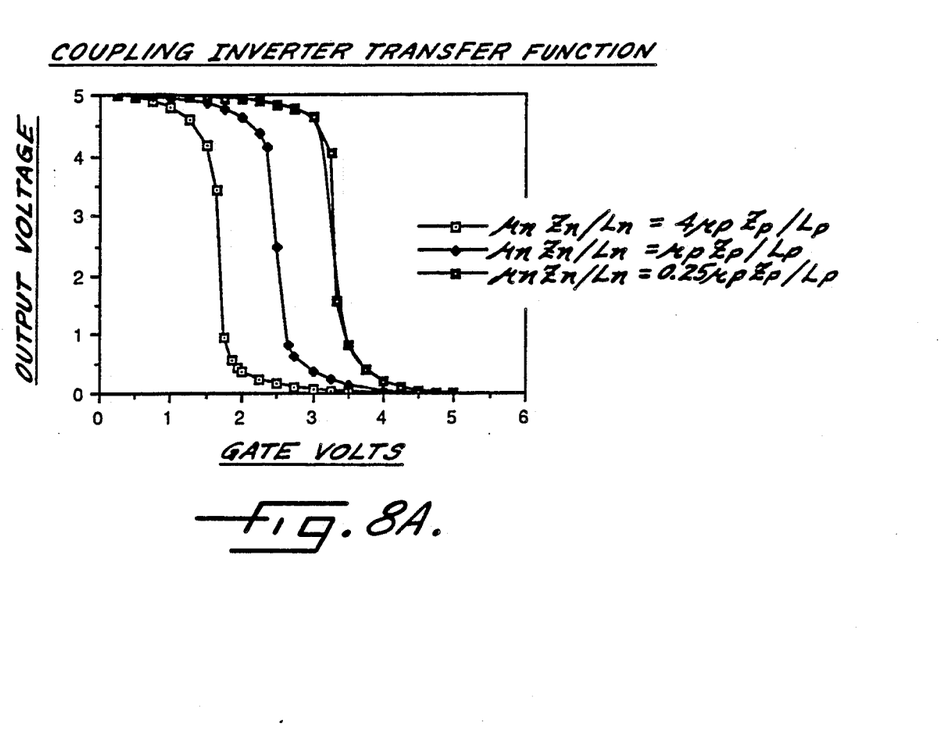
FIGS. 8A-8B illustrate transfer functions of complementary FET inverters according to the present invention.

Referring now to FIG. 8A three superimposed coupling inverter transfer functions are illustrated. The central curve corresponds to a balanced coupling inverter design where $\mu_n Z_n / L_n = \mu_p Z_p / L_p$ where Z and L are channel width and length of an N-type FET and P-type FET and $\mu$ is the appropriate carrier mobility. It is apparent from FIG. 8A that the coupling inverter output voltage switches abruptly between voltage limits at a specific value of gate input voltage. The maximum rate of change in output voltage occurs when the coupling inverter output reaches half of its maximum value. The input voltage where this rapid voltage transition occurs is controlled by the physical dimensions of the P- and N- transistors which comprise the coupling inverter.

Still referring to FIG. 8A, the left hand voltage transfer function occurs at a significantly lower value of input voltage than a symmetric inverter design. In this case, saturation current of the N- channel transistor dominates saturation current capabilities of the P- channel device. Specifically, the design criteria at the left hand curve of FIG. 8A is $\mu_n Z_n / L_n = 4 \mu_n Z_p / L_p$. The opposite situation occurs when the P- channel transistor design dominates saturation current of the N- channel device. The right hand curve of FIG. 8A reflects this design criteria, i.e. $\mu_n Z_n / L_n = 0.25 \mu_p Z_p / L_p$.

According to the invention, these skewed responses are the required design criteria for complementary inverter 14 of FIGS. 1–7. The left hand voltage transfer curve criteria is a design criteria for all OR gates, for example as illustrated in FIGS. 1, 3, 4, 5, 6 and 7. The right hand criteria is a design criteria for AND gates as illustrated in FIG. 2. If these critical design criteria are not utilized in the design of the coupling inverter, switching speed is reduced and idle power is high negating most of the benefits of all parallel logic. The skewed complementary inverter design minimizes the "lift-off" time described below in connection with the "snap-off" property of the present invention. The fast switching of the skewed inverter design is utilized to provide all logic circuits of the present invention with maximum switching power and minimum or zero idling power.

Figure 8B:
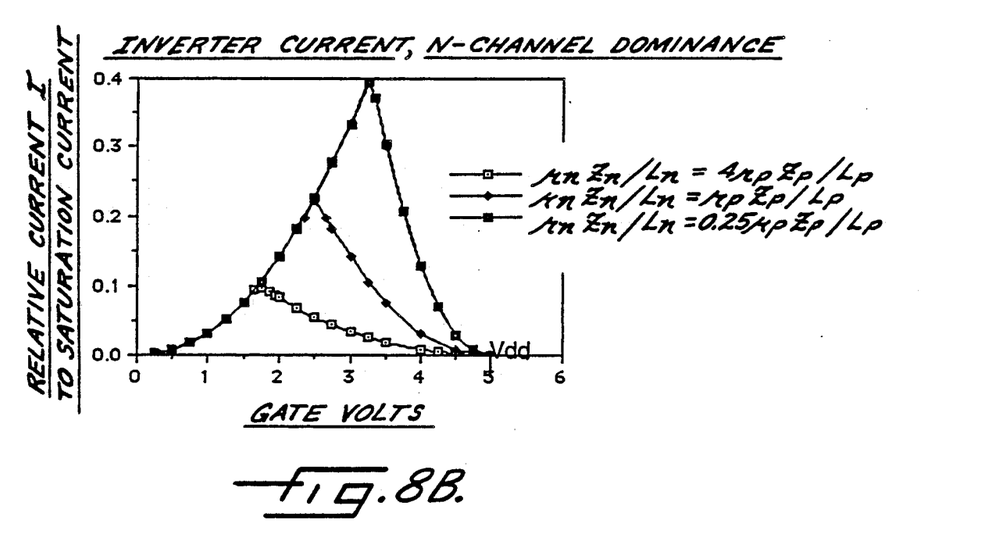

Referring now to FIG. 8B the current flowing in the transistors 14a and 14b comprising the skewed complementary inverter 14 of the present invention will now be illustrated. This current is plotted as a function of gate voltage and inverter design and is normalized to a saturation current of the N- channel transistor. This transistor current is not available to charge or discharge circuit capacity; excess current serves that purpose. The input voltage to the inverter 14 is the common output 16. Accordingly, referring to FIG. 3, assuming that common output 16 is at power supply voltage $V_{dd}$, then the inverted drain follower transistor 13 is on by virtue of the down level of the inverter output voltage 17 which is coupled to the gate 13a of transistor 13. Transistor 21 of FIG. 4 would therefore be off. When any one of the driving stage FETs 11a–11n are provided with a positive up level voltage at gate 12a–12n, current flows through transistor 13 and the selected driver transistor 11. This current causes the common output 16 to drop. When the common output 16 drops below a critical value the output 17 of inverter 14 abruptly increases to plus $V_{dd}$, shutting off transistor 13. At the same time, transistor 21 is switched on.

Figure 9:
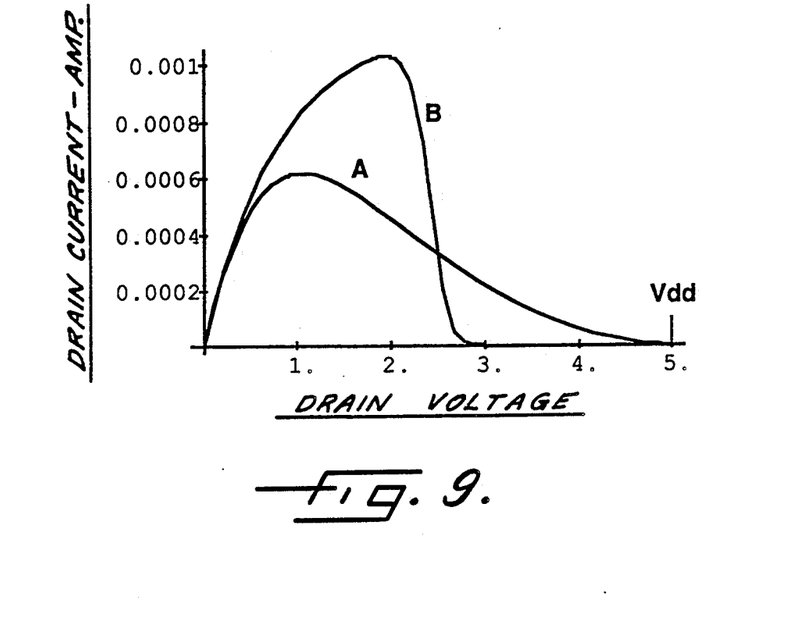
FIG. 9 illustrates the current voltage transfer function of an inverted drain follower load transistor according to the present invention.

Referring now to FIG. 9, the unique drain current property of inverted drain follower 13 is illustrated as a function of drain voltage, where channel length is 1 $\mu$m and channel width is 5 $\mu$m and the substrate is doped with 2e16 exceptor ions per cm$^3$. As shown in FIG. 9 the unique characteristic of inverter drain follower 13 is that zero drain current occurs at both extremes of drain voltage. Between these end point voltages a substantial drain current flows that functions to charge or discharge circuit capacitances. The area under the curves shown in FIG. 9 is the capacitive charging power. The amount of available power is controlled by the physical dimensions of transistor 13.

The zero end point current character of the inverted drain follower insures that no drain current flows at either output level of the logic. No idle power is dissipated by an enhancement inverted drain follower 13. A depletion mode inverter drain follower may also be provided in order to provide the total lift-off function by providing a sustaining current that controls the "snap-off" property of the logic circuits of the present invention. There are two plots illustrated in FIG. 9. For curve A, it is assumed that the coupling inverter transfer function is linear. Curve B reflects the actual Fermi-Dirac type of transfer function typical of a CMOS type inverter.

Figure 10A:
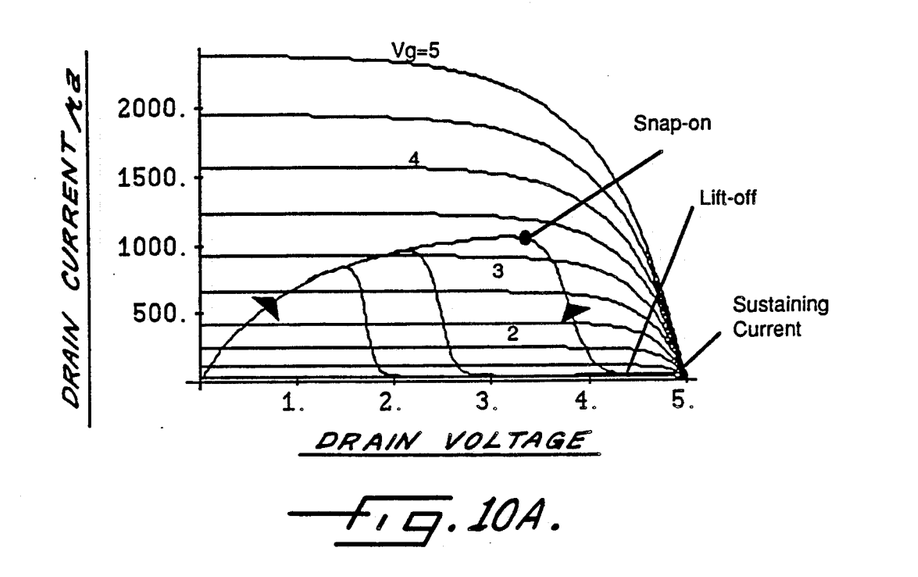
FIGS. 10A-10B illustrate switching diagrams for FET logic circuits of the present invention.
Figure 10B:
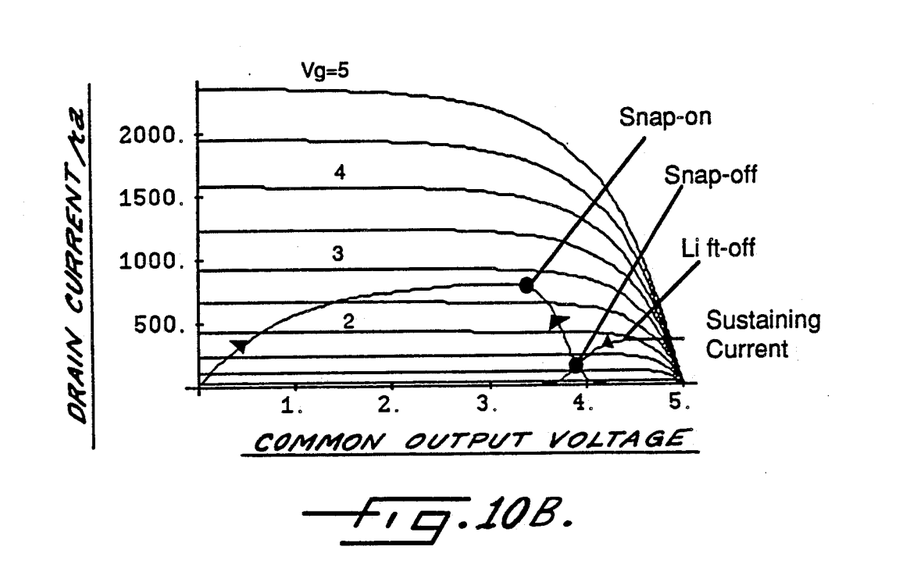

Referring now to FIG. 10 the switching action of logic circuits 10 according to the present invention is graphically illustrated. FIG. 10 shows the combined plots of drain current flowing in a 1 $\mu$m N- channel inverted drain follower device 13 driven with different designs of coupling inverter 14, and the drain current flowing in a 1 $\mu$m P-channel and logic gate input transistor. In both transistor designs oxide thickness is 120Å. As gate to source voltage of the P- channel logic transistor increases drain current increases and a "snap-on" drain current value is achieved that initiates an irreversible switching action. Snap-on does not occur for any value of gate voltage below the value needed to produce snap-on drain current. This switching property provides the logic circuits of the present invention with high tolerance to noise signals.

For switching to occur, the gate voltage of any selected driving transistor 11 must be above the snap-on value. Snap-on voltage is above the threshold voltage of the driving transistor 11. The value of the snap-on gate voltage is controlled by the relative dimensions of the inverter drain follower 13 compared to any one of the driving transistors 11. In particular, the product of the carrier mobility, and the ratio of channel width to length of the driving transistor 11 is made greater than the product of carrier mobility and the ratio of channel width to length of the load FET 13. Given the drain supply voltage of 5V, snap-on voltage Will be 2.5V if the drain saturation current of a driving transistor 11 is exactly twice that of the inverted drain follower transistor 13.

To turn the logic gate off, when second load transistor 18 of FIG. 3 is switched on by the action of gate 12b returning to the down level, it provides a sustaining current for logic gate conduction current that controls the snap-off property of the logic gate of the present invention. When on, transistor 18 provides idle (pull-up) current when the OR gate is on and its output is at the down level. A similar situation occurs when the output of an AND gate is at the up level. A typical sustaining current flowing in transistor 18 is 10 $\mu$A and accounts for power dissipation typically of about 50 $\mu$watt per logic function. The multigate configuration of FIG. 5 operates as described above, except no idle power is dissipated at either logic state up or down.

Figure 11:
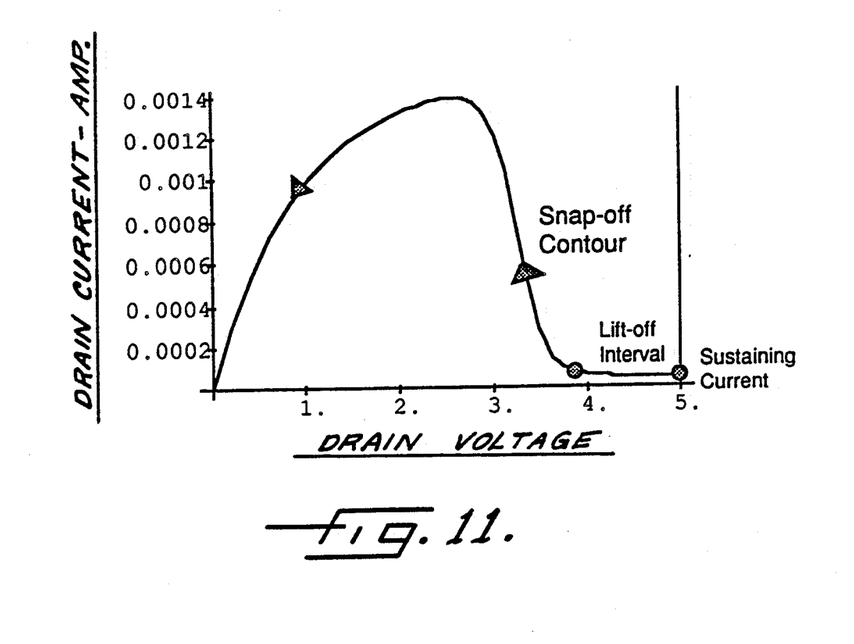
FIG. 11 illustrates the superposition of sustaining current and inverted drain follower load transistor current characteristics of the FET logic circuits of the present invention.

According to the invention, the need for a separate lift-off transistor 18 is eliminated by making the inverted drain follower transistor 13 a depletion mode device, as shown in FIGS. 1 and 2. When inverted drain follower transistor 13 is a depletion mode device a prescribed amount of sustaining current is caused to flow when the gate voltage of transistor 13 equals its source voltage. FIGS. 10A, 10B and 11 illustrate the effects of adding idle current to the inverted drain follower current voltage profile. A non-zero current is shown to flow in the circuit when the output terminal voltage reaches a maximum of $V_{dd}$. This current is called the sustaining current and defines the snap-off current threshold. As gate voltage of the P- channel logic gate, for example, is decreased, drain current drops. When this current drops below the sustaining current at the quiescent ON intercept, the logic output voltage drops along the contour called the lift-off interval as shown in FIGS. 10B and 11. At the end of the lift-off interval current flowing in the inverted drain follower 13 commences to rapidly switch the logic circuit to the off state and all current flow ceases. In effect, the lift-off interval adds delay time to overall switching performance and may be used for that purpose in some logic situations. However, this delay time must be held to a minimum value by using the skewed inverter design of the present invention to achieve the maximum switching rate. The magnitude of the sustaining current is controlled entirely by the width to length ratio of the enhancement transistors 18 or 13, when used or the depletion mode design of transistor 13. Any value of sustaining current may be selected by the design of transistor 18 however sustaining current should be lower than value chosen for the snap-on current described above in order to preserve the hysteresis effect.

The snap-off current is usually a fraction of the snap-on current and accounts for the hysteresis property of the logic gates of the present invention. The time the entire circuit remains in the lift-off interval, $T_{LO}$, depends on capacitive loading C, sustaining current $I_S$ and lift-off voltage interval $V_{LO}$ as follows: $T_{LO} = CV_{LO}/I_S$. A typical logic function lift-off time is $0.5 \times 10^{-9}$ seconds. Lift-off time depends inversely on the sustaining current and directly upon the lift-off voltage interval and therefore can be selected primarily by the degrees of inverter skew and the value of sustaining current. Once out of the lift-off interval, the capacitive charging power of the inverted drain follower 13 dominates and overall very fast switching times result. It is critical that the lift-off interval be made small by skewing the voltage transfer function of the complementary inverter 14 as has been described above. Otherwise the virtues of using the inverted drain follower 13 are greatly diminished.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A field effect transistor (FET) logic circuit comprising:
   a driving stage including at least one FET of a first conductivity type, having at least one control electrode for receiving logic input signals, the at least one driving stage FET being connected between a common output and a first potential level;
   a load FET of second conductivity type, connected between a second potential level and said common output; and
   a complementary FET inverter comprising an FET of said first conductivity type and an FET of said second conductivity type, serially connected between said first and second potential levels, the output of said complementary inverter being connected to the control electrode of said load FET, the product of the carrier mobility and the ratio of channel width to length of the inverter FET of said first conductivity type being substantially greater than the product of the carrier mobility and the ratio of channel width to length of the inverter FET of said second conductivity type.

2. The FET logic circuit of claim 1 wherein said logic circuit is an OR circuit with said first conductivity type being N-type and said second conductivity type being P-type.

3. The FET logic circuit of claim 1 wherein said logic circuit is an AND circuit with said first conductivity type being P-type and said second conductivity type being N-type.

4. The FET logic gate of claim 1 wherein said driving stage FETs are enhancement type FETs.

5. The FET logic gate of claim 4 wherein said driving stage FETs are enhancement type FETs having an induced channel.

6. The FET logic gate of claim 1 wherein the product of the carrier mobility and the ratio of channel width to length of the inverter FET of said first conductivity type is four times the product of the carrier mobility and the ratio of channel width to length of the inverter FET of said second conductivity type.

7. The FET logic gate of claim 1 wherein said load FET is a depletion mode FET.

8. The FET logic gate of claim 1 wherein said load FET is slightly conductive when the control electrode thereof is near said second potential level.

9. The FET logic gate of claim 1 wherein said load FET is highly conductive when the control electrode thereof is near said first potential level.

10. The FET logic gate of claim 1 further comprising a second load FET of said second conductivity type, connected between said second potential level and said common output, the control electrode of said second load FET being connected to one of the control electrodes of said driving stage FETs.

11. The FET logic gate of claim 1 wherein the product of the carrier mobility and the ratio of channel width to length of said driving stage FETs is greater than the product of carrier mobility and the ratio of channel width to length of said load FET.

12. A field effect transistor (FET) logic circuit comprising:
   a driving stage including at least one FET of a first conductivity type, having at least one control electrode for receiving logic input signals, the at least one driving stage FET being connected between a common output and a first potential level;
   a load FET of second conductivity type, connected between a second potential level and said common output;
   a complementary FET inverter comprising an FET of said first conductivity type and an FET of said second conductivity type, serially connected between said first and second potential levels, the output of said complementary inverter being connected to the control electrode of said load FET, the product of the carrier mobility and the ratio of channel width to length of the inverter FET of said first conductivity type being substantially greater than the product of the carrier mobility and the ratio of channel width to length of the inverter FET of said second conductivity type;
   a second load FET of said conductivity type, connected between said second potential and said common output; and
   a second complementary FET inverter comprising an FET of said first conductivity type and an FET of said second conductivity type, serially connected between said first and second potential levels, the output of said second complementary FET inverter being connected to the control electrode of said second load FET.

13. The FET logic gate of claim 12 wherein the product of the carrier mobility and the ratio of channel width to length of the second complementary inverter FET of said first conductivity type is equal to the product of the carrier mobility and the ratio of channel width to length of the second complementary inverter FET of said second conductivity type.

14. The FET logic gate of claim 12 wherein said second load FET comprises an FET having a plurality of gate electrodes, a respective one of said plurality of second load FET gate electrodes being connected to a respective one of the control electrodes of said driving stage FETs.

15. The FET logic gate of claim 14 wherein said second load FET is a multigate Fermi-Threshold FET.

16. The FET logic gate of claim 1 wherein at least one driving stage FET comprises a driving stage FET having a plurality of control electrodes for receiving logic input signals.

17. The FET logic gate of claim 16 wherein said driving stage FET having a plurality of control electrodes comprises a multigate Fermi-Threshold FET.

18. The FET logic gate of claim 1 wherein at least two driving stage FETs are connected in parallel with each other between said common output and said first potential level.

19. The FET logic gate of claim 1 wherein at least two driving stage FETs are connected in series between said common output and said first potential level.

20. The FET logic gate of claim 1 wherein at least three driving stage FETs are connected in a series/parallel configuration between said common output and said first potential level.

* * * * *

UNITED STATES PATENT AND TRADEMARK OFFICE
CERTIFICATE OF CORRECTION

PATENT NO. : 5,001,367

DATED : March 19, 1991

INVENTOR(S) : Vinal

It is certified that error appears in the above-identified patent and that said Letters Patent is hereby corrected as shown below:

Column 3, line 62, please delete "Will" and substitute --will-- therefor.

Column 4, line 18, please delete "betWeen" and substitute --between-- therefor.

Column 6, lines 5 and 6, please delete "(43a·4-4a·45a)" and substitute (43a·44a·45a) therefor.

Column 6, line 63, please delete "Would" and substitute --would-- therefor.

Column 7, line 57, please delete "Will" and substitute --will-- therefor.

Signed and Sealed this

Twenty-ninth Day of December, 1992

Attest:

DOUGLAS B. COMER

Attesting Officer

Acting Commissioner of Patents and Trademarks